United States Patent
Shim et al.

(10) Patent No.: US 9,122,165 B2
(45) Date of Patent: Sep. 1, 2015

(54) METHOD OF MANUFACTURING GRAPHENE, CARBON NANOTUBES, FULLERENE, GRAPHITE OR A COMBINATION THEREOF HAVING A POSITION SPECIFICALLY REGULATED RESISTANCE

(71) Applicant: Samsung Electronics Co., Ltd., Suwon-si, Gyeonggi-do (KR)

(72) Inventors: Jeo-young Shim, Yongin-si (KR); Tae-han Jeon, Hwaseong-si (KR); Kun-sun Eom, Seoul (KR); Dong-ho Lee, Seongnam-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 17 days.

(21) Appl. No.: 14/050,053

(22) Filed: Oct. 9, 2013

(65) Prior Publication Data
US 2014/0302439 A1   Oct. 9, 2014

(30) Foreign Application Priority Data
Apr. 5, 2013   (KR) .................. 10-2013-0037682

(51) Int. Cl.
| G03F 7/09 | (2006.01) |
| G03F 7/16 | (2006.01) |
| G03F 7/20 | (2006.01) |
| C01B 31/04 | (2006.01) |
| G03F 7/11 | (2006.01) |

(52) U.S. Cl.
CPC .......... G03F 7/2059 (2013.01); C01B 31/0484 (2013.01); G03F 7/09 (2013.01); G03F 7/11 (2013.01); G03F 7/16 (2013.01); *Y10T 428/30* (2015.01)

(58) Field of Classification Search
CPC ............... G03F 7/09; G03F 7/11; G03F 7/16; G03F 7/2059; C01B 31/0484; Y10T 428/30
USPC .............. 430/296, 942; 257/27, 28, E29.068, 257/E33.005
See application file for complete search history.

(56) References Cited

U.S. PATENT DOCUMENTS

| 2012/0241069 A1 | 9/2012 | Hofmann et al. |
| 2013/0075700 A1* | 3/2013 | Yang et al. ...................... 257/27 |
| 2013/0099205 A1* | 4/2013 | Liu et al. ......................... 257/28 |

FOREIGN PATENT DOCUMENTS

| KR | 101127742 B1 | 3/2010 |
| KR | 1020110042952 A | 4/2011 |
| KR | 1020120029664 A | 3/2012 |
| KR | 1020120033148 A | 4/2012 |
| KR | 1020120037882 A | 4/2012 |
| KR | 1020120053294 A | 5/2012 |
| KR | 1020120114586 A | 10/2012 |
| KR | 1020120125069 A | 11/2012 |

OTHER PUBLICATIONS

Lee et al., "Chemical Isolated Graphene Nanoribbons Reversibly Formed in Fluorographene Using Polymer Nanowire Masks," *Nano Lett.* 11: 5461-5464 (Nov. 3, 2011).
Liu, G. et al., "Tuning of Graphene Properties via Controlled Exposure to Electron Beams," *IEEE*, 1-6, (2010).
Zan, Recep et al., "Interaction of Metals with Suspended Graphene Observed by Transmission Electron Microscopy", *The Journal of Physical Chemistry*, 3, 953-958, (2012).

* cited by examiner

*Primary Examiner* — Christopher Young
(74) *Attorney, Agent, or Firm* — Leydig, Voit & Mayer, Ltd.

(57) ABSTRACT

Provided are a method of manufacturing graphene, carbon nanotubes, fullerene, graphite, or a combination thereof having a regulated resistance, and a material manufactured using the method.

19 Claims, 3 Drawing Sheets

METHOD OF MANUFACTURING GRAPHENE, CARBON NANOTUBES, FULLERENE, GRAPHITE OR A COMBINATION THEREOF HAVING A POSITION SPECIFICALLY REGULATED RESISTANCE

CROSS-REFERENCE TO RELATED APPLICATIONS

This application claims the benefit of Korean Patent Application No. 10-2013-0037682, filed on Apr. 5, 2013, in the Korean Intellectual Property Office, the entire disclosure of which is incorporated herein by reference.

BACKGROUND

1. Field

The present disclosure relates to a method of manufacturing graphene, carbon nanotubes, fullerene, graphite, or a combination thereof having a regulated resistance, and a material manufactured using the method.

2. Description of the Related Art

Graphene is a substance made of pure carbon, with atoms arranged in a regular hexagonal pattern similar to graphite, but in a one-atom thick sheet. It is an allotrope of carbon whose structure is a single planar sheet of sp2-bonded carbon atoms.

Carbon nanotubes (CNTs) are allotropes of carbon with a cylindrical nanostructure. These cylindrical carbon molecules may be used in nanotechnology, electronics, optics and other fields of materials science and technology. Carbon nanotubes are members of the fullerene structural family.

Graphite is an allotrope of carbon. Graphite is a semimetal, which is an electrical conductor. Graphite may be used as an electrode.

A fullerene is a molecule of carbon which may have the shape of a tube, a sphere or an ellipsoid. When the fullerenes are spherical, they are often called buckyballs. Cylindrical fullerenes are referred to as carbon nanotubes or buckytubes. Fullerenes have a similar structure to graphite that is formed of stacked graphene sheets of fused hexagonal rings, but the fullerenes may have pentagonal rings (occasionally, heptagonal rings).

Graphene, carbon nanotubes, fullerene, or graphite may be patterned to form a fine structure. For example, the patterning process may include forming a pattern by etching a structure of a carbon material by an atomic force microscope (AFM), transmission electron microscope (TEM), focused ion beam (FIB), or photolithography process. However, a structure prepared in this manner may be physically or chemically damaged during the process, or the characteristics of the structure may be changed due to materials used in the process.

Therefore, improved methods of changing the electrical characteristics of graphene, carbon nanotubes, fullerene, or graphite still needed.

SUMMARY

Provided is a method of efficiently manufacturing graphene, carbon nanotubes, fullerene, graphite, or a combination thereof having a position-specific regulated resistance.

Provided are graphene, carbon nanotubes, fullerene, graphite, or a combination thereof having a position-specific regulated resistance, which are manufactured using the method.

Additional aspects will be set forth in part in the description which follows and, in part, will be apparent from the description, or may be learned by practice of the presented embodiments.

According to an aspect of the present invention, a method of manufacturing graphene, carbon nanotubes, fullerene, graphite, or a combination thereof having a position-specific regulated resistance includes depositing a metal-containing material onto the graphene, carbon nanotubes, fullerene, graphite, or combination thereof, wherein the metal is Al, Ni, Fe, Co, Ti, Cr, or a combination thereof to form a structure; and irradiating an electron beam on one or more specific areas of the structure.

According to another aspect of the present invention, graphene, carbon nanotubes, fullerene, graphite, or a combination thereof having a position-specific regulated resistance, wherein a metal-containing material is deposited on a surface of the graphene, carbon nanotubes, fullerene, graphite, or combination thereof, wherein the metal is Al, Ni, Fe, Co, Ti, Cr, or a combination thereof is provided.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
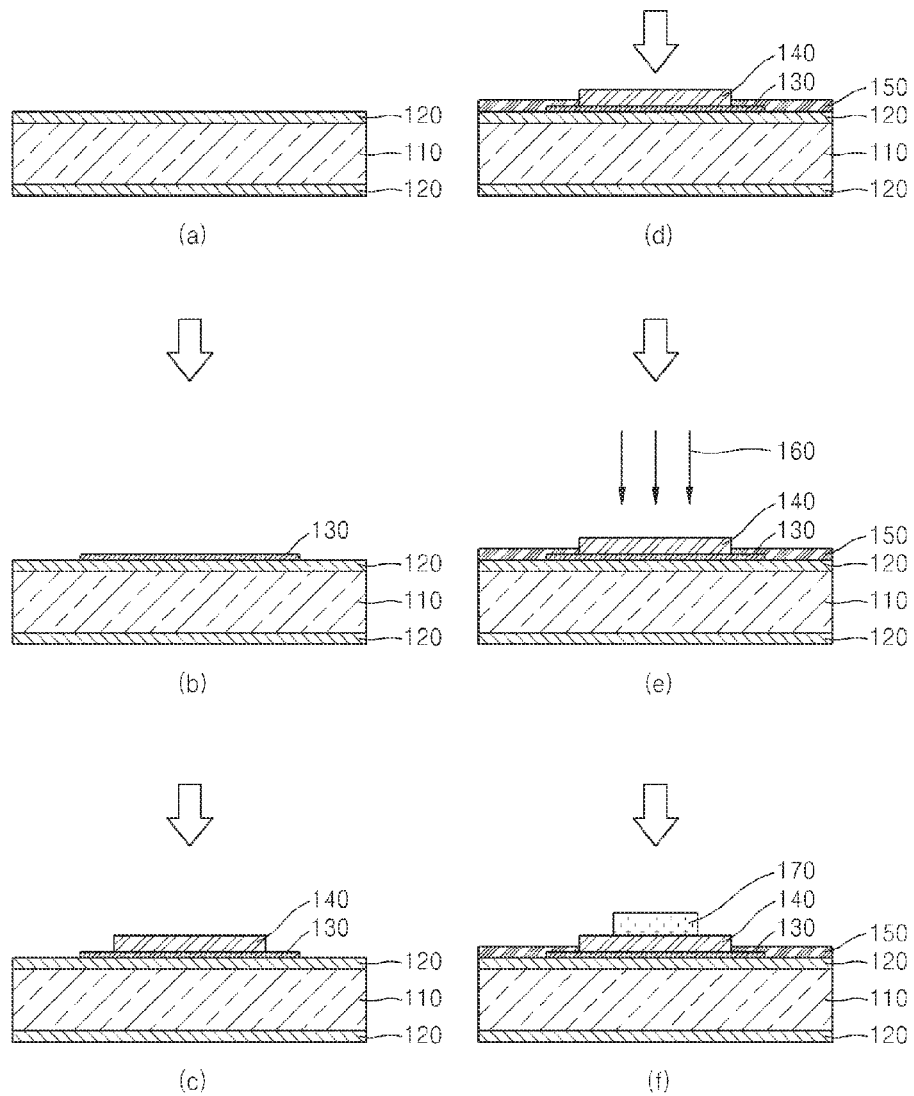
FIG. 1 is a diagram that illustrates a process of manufacturing a transistor including graphene having a position-specific regulated electric resistance by irradiating an electron beam.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

According to an aspect of the present invention, a method of manufacturing graphene, carbon nanotubes, fullerene, graphite, or a combination thereof having a position-specific regulated resistance includes depositing a metal-containing material onto the graphene, carbon nanotubes, fullerene, graphite, or combination thereof, wherein the metal is Al, Ni, Fe, Co, Ti, Cr, or a combination thereof to form a structure; and irradiating an electron beam on one or more specific areas of the structure is provided.

A method of manufacturing graphene, carbon nanotubes, fullerene, graphite, or a combination thereof having a position-specific regulated resistance according to an embodiment of the present invention includes depositing a metal-containing material on the graphene, carbon nanotubes, fullerene, graphite, or combination thereof, wherein the metal is Al, Ni, Fe, Co, Ti, Cr, or a combination thereof.

In the method, the depositing process includes coating or forming the metal-containing material on the graphene, carbon nanotubes, fullerene, graphite, or combination thereof. The depositing process may be a method that is performed by filament deposition, E-beam evaporation, atomic layer deposition (ALD), sputter deposition, chemical vapor deposition (CVD), or a combination thereof.

The metal-containing material may be an insulating material. When the metal-containing material is an insulating material, further processes may be performed without coating a separate insulating material after manufacturing the graphene, carbon nanotubes, fullerene, graphite, or combination thereof having a position-specific regulated resistance. For example, a field effect transistor (FET) may be manufactured by forming a gate electrode on the insulating material after manufacturing the graphene, carbon nanotubes, fullerene, graphite, or combination thereof having a position-specific regulated resistance. The insulating material may be $Al_2O_3$, $NiO$, $Ni_2O_3$, $Fe_2O_3$, $Fe_3O_4$, $CoO$, $Co_2O_3$, $Co_3O_4$, $TiO_2$, $TiO$, $Ti_2O_3$, $CrO$, $Cr_2O_3$, $CrO_2$, $Cr_2O_3$, or a combination thereof.

The metal-containing material may be a metal or a metal oxide. The metal oxide may be $Al_2O_3$, $NiO$, $Ni_2O_3$, $Fe_2O_3$, $Fe_3O_4$, $CoO$, $Co_2O_3$, $Co_3O_4$, $TiO_2$, $TiO$, $Ti_2O_3$, $CrO$, $Cr_2O_3$, $CrO_2$, $Cr_2O_3$, or a combination thereof.

The thickness of the metal-containing material may be from about 0.1 nm to about 1000 nm, for example, from about 1 nm to about 1000 nm, from about 10 nm to about 1000 nm, from about 100 nm to about 1000 nm, from about 500 nm to about 1000 nm, from about 0.1 nm to about 800 nm, from about 0.1 nm to about 500 nm, from about 0.1 nm to about 100 nm, from about 10 nm to about 100 nm, from about 10 nm to about 800 nm, from about 100 nm to about 500 nm, or from about 10 nm to about 50 nm.

In the method, the graphene, carbon nanotubes, fullerene, graphite, or combination thereof may be suspended and not supported by a substrate. For example the lower surface of the graphene, carbon nanotubes, fullerene, graphite, or combination thereof may be unsupported, but side walls of the graphene, carbon nanotubes, fullerene, graphite, or combination thereof may be fixed and supported by a substrate.

The method may further include depositing or otherwise positioning the graphene, carbon nanotubes, fullerene, graphite, or combination thereof on a substrate.

The positioning process may include forming, fixing, or coating the graphene, carbon nanotubes, fullerene, graphite, or combination thereof on a substrate. In the case of graphene, the graphene may be formed on the substrate, or the method may include transferring graphene formed elsewhere onto the substrate.

The substrate may be an insulating material. The insulating material may be a material that has an electrically insulating function. The substrate may be silicon, a silicon oxide, a silicon nitride ($Si_3N_4$), $Al_2O_3$, $TiO_2$, glass, a semiconductor, a polymer, or a combination thereof. The substrate may be a substrate that is used in a thin film transistor (TFT) or flexible display. The substrate may have an arbitrary thickness.

The method includes irradiating an electron beam on one or more areas of the structure obtained as a result of the depositing process.

The irradiating of the electron beam may be performed in the presence of an electron beam mask or may be performed without an electron beam mask. Also, the irradiating of the electron beam may be performed in the presence of an electron beam resist or may be performed without an electron beam resist. For example, the irradiating of the electron beam may be performed by irradiating an electron beam at given coordinates according to a program instructing the electron beam to be irradiated on a specific position or area based on a specific position marker existing on the substrate.

The irradiating of the electron beam may be performed in a position-specific manner. The term 'position specific' refers to an area where the electron beam is irradiated, as opposed to an area where the electron beam is not irradiated. In other words, the electron beam is irradiated on specific positions (only a portion) of the structure. Accordingly, the area where the electron beam is not irradiated may form a particular pattern. The shape of the area where the electron beam is not irradiated may be, for example, a pattern in a nanometer scale. For example, the pattern may be a graphene nanoribbon (GNR). A graphene nanoribbon (GNR) may include a ribbon shaped graphene, wherein the width is in the range of 1 nm to 1000 nm, for example, 1 nm to 800 nm, 1 nm to 600 nm, 100 nm to 1000 nm, or 100 nm to 800 nm. The electrical resistance of the area of the structure (or, more specifically, the graphene corresponding to the area of the structure) where the electron beam is irradiated may be greater than the electrical resistance of the area where the electron beam is not irradiated. The resistance of the area where the electron beam is irradiated may be 2 times or more, 3 times or more, 4 times or more, 5 times or more, 6 times or more, 7 times or more, 10 times or more, 20 times or more, 40 times or more, 50 times or more, from 2 times to 190 times, from 3 times to 190 times, from 4 times to 190 times, from 5 times to 190 times, from 10 times to 190 times, from 20 times to 190 times, from 30 times to 190 times, from 50 times to 190 times, or from 100 times to 190 times greater than the electrical resistance of the area where the electron beam is not irradiated. Accordingly, the area where the electron beam is irradiated may have an increased electrical resistance and lose electrical characteristics and, thus, may be used to delimit the area where an electron beam is not irradiated, which may be used as an electric conductive material. For example, the area where the electron beam is not irradiated may be used as an electrode material in a transistor or as an electrode.

The irradiating of the electron beam may be performed at a power in a range of about 5 kV to about 100 kV, for example, about 5 kV to about 50 kV, about 5 kV to about 30 kV, about 5 kV to about 20 kV, about 5 kV to about 10 kV, about 10 kV to about 100 kV, about 30 kV to about 100 kV, about 40 kV to about 100 kV, or about 50 kV to about 100 kV. The irradiating of the electron beam may be performed at a current in a range of about 20 pA to about 300 pA, for example, about 20 pA to about 200 pA, about 20 pA to about 100 pA, about 20 pA to about 80 pA, about 20 pA to about 60 pA, about 50 pA to about 300 pA, about 100 pA to about 300 pA, or about 150 pA to about 300 pA. Also, the irradiating of the electron beam may be performed under a condition of not etching the graphene, carbon nanotubes, fullerene, graphite, or combination thereof. For example, the irradiating of the electron beam may be performed in a vacuum and/or under a condition where the graphene, carbon nanotubes, fullerene, graphite, or combination thereof is not directly exposed to air. The condition of not directly exposing the graphene, carbon nanotubes, fullerene, graphite, or combination thereof to air may indicate that the metal-containing material is deposited on the graphene, carbon nanotubes, fullerene, graphite, or combination thereof so that the graphene, carbon nanotubes, fullerene, graphite, or combination thereof is not directly exposed to the vacuum and/or air. In this regard, an etching process may not be performed since the graphene, carbon nanotubes, fullerene, graphite, or combination thereof may not transform into $CO$ and/or $CO_2$ or a hydrocarbon, or even when transformed, the CO and/or $CO_2$ or a hydrocarbon cannot be discharged into the vacuum or air, and thus the etching process may not progress further.

The method may further include separating the metal-containing material and the graphene, carbon nanotubes, fullerene, graphite, or combination thereof after the irradiating of the electron beam.

The separating process may include separating the graphene, carbon nanotubes, fullerene, graphite, or combination thereof from the metal-containing material using a known method in the art. For example, the graphene, carbon nanotubes, fullerene, graphite, or combination thereof may be manually or physically detached from the metal-containing material, or the graphene, carbon nanotubes, fullerene, graphite, or combination thereof may be first attached to an adhesive and then separated from the metal-containing material.

The method may further include removing at least a part of the area where the electron beam is irradiated after the irradiating of the electron beam. The removing process may be performed by using a method of etching method known in the art. The etching method may be a dry etching method, a wet etching method, or a combination thereof. The dry etching method may be a plasma etching method, an electron beam irradiation etching method, or a combination thereof. The etching process may be performed by photolithography.

Also, the method may further include forming a source electrode and a drain electrode to facing each other on the graphene, carbon nanotubes, fullerene, graphite, or combination thereof having a position-specific regulated resistance; and forming a FET by forming a gate electrode on an area where the electron beam is not irradiated.

According to another aspect of the present invention, provided is graphene, carbon nanotubes, fullerene, graphite, or a combination thereof having a position-specific regulated resistance manufactured using the method described above.

The graphene, carbon nanotubes, fullerene, graphite, or combination thereof having a position-specific regulated resistance may have a nanopattern formed on an area where the electron beam is not irradiated, i.e., an area having electrical characteristics such as electric conductivity. The pattern may be a nanoribbon, a nanowire, or a combination thereof. The pattern may be used as an electrode or a conductive material in a transistor.

The present invention will be described in further detail with reference to the following examples. These examples are for illustrative purposes only and are not intended to limit the scope of the present invention.

Example 1

Change in Resistance of Electron-Beam Irradiated Graphene on Which $Al_2O_3$ is Coated In the current embodiment, the effect of electron-beam irradiation on electric resistance of graphene after coating $Al_2O_3$ on the graphene and irradiating an electron beam was confirmed.

In this regard, a transistor including graphene having a position-specific regulated resistance by irradiating an electron beam was formed.

FIG. 1 illustrates a process of manufacturing the transistor including graphene having a position-specific regulated resistance by irradiating an electron beam.

As shown in FIG. 1, an insulating layer 120 was formed on each surface of a silicon substrate 110. An insulating material in the insulating layer 120 may be a silicon oxide or a silicon nitride. The insulating layer 120 may have a thickness sufficient enough to have an insulating effect. The thickness may be from about 100 nm to about 500 nm. The substrate may be a silicon wafer. In the current embodiment, the insulating material was a silicon oxide having a thickness of about 300 nm formed by thermal growth. As a result, a structure having the silicon oxide layers 120 on both surfaces of the silicon substrate 110 was prepared (a structure A).

Next, a graphene sheet 130 was formed on the insulating layer 120. The graphene sheet 130 was prepared by depositing carbon on the substrate by using inductively-coupled plasma chemical vapor deposition (ICP-CVD) equipment and a carbon source. A temperature for forming the graphene sheet 130 was about 750° C., and the substrate was Ni (15 nm)/Cu (300 nm)/$SiO_2$ (200 nm)/Si (about 750 μm). A thickness of the graphene sheet 130 was about 1 nm, and the graphene sheet 130 was a triple layer on average. Polymethyl methacrylate (PMMA) with a thickness of about 200 nm was coated on the graphene sheet 130, and then the graphene sheet 130 was physically separated from the substrate. After the separation, the PMMA film was cut into a size of 70 mm×70 mm, and then Cu/Ni remained on a surface of the separated cross section was removed by etching with $FeCl_3$. After wetting, the graphene sheet 130 on the PMMA film with water, the graphene sheet 130 was transferred to the insulating layer 120. The PMMA film remaining on the graphene sheet 130 was removed by using acetone. After removing the PMMA film, the remaining acetone and water were removed by baking the graphene sheet 130 in vacuum at a temperature of about 250° C. for about 3 hours. As a result, graphene was formed on the substrate. Here, the transferred graphene sheet 130 had a size of about 70×70 $mm^2$. Next, photoresist (PR) (AZ1512) was coated on the transferred graphene sheet 130 and patterned by photolithography. As a result, a graphene micro ribbon having a width of about 2 μm to 10 μm was formed by removing a part of the graphene sheet 130. Here, graphene etching was performing by applying a plasma ashing process on the graphene sheet 130 for several seconds, and then the remaining PR was removed by using a PR remover in a wet process. As a result, a structure is formed having the graphene sheet 130 that is patterned in a micro size on the silicon oxide layer 120 on one surface of the silicon substrate 110 (a structure B).

Next, a metal-containing layer 140 was deposited on the graphene sheet 130. $Al_2O_3$ was used as the metal-containing material (thus, the metal-containing layer 140 may be referred to as "an $Al_2O_3$ layer 140"). The $Al_2O_3$ layer 140 was deposited with a film uniformity of ±2% by using gas of trimethyl aluminum (TMA) and water at a deposition temperature of about 150° C. by using an atomic layer deposition (ALD) process, and a thickness of the $Al_2O_3$ layer 140 was from about 10 nm to about 100 nm. Then, PR (AZ1512) was coated on the $Al_2O_3$ layer 140 and patterned by photolithography. After the patterning process, the $Al_2O_3$ layer 140 was etched by using a buffered oxide etch (BOE) solution. As a result, a part of the $Al_2O_3$ layer 140 was removed to prepare an area where a contact line 150 working as an electrode may be deposited on the graphene sheet 130 (a structure C).

Next, the contact line 150 was deposited on the graphene sheet 130. The contact line 150 may be Ti/Au or Cr/Au. In the current embodiment, Ti/Au was deposited as the contact line 150 at a thickness of 10 nm/50 nm (a structure D).

Then, an electron beam was irradiated on a specific area of the graphene sheet 130 through the $Al_2O_3$ layer 140. The area of the graphene where the electron beam was not irradiated was to be a nanoribbon. In this case, electron beam resist was not used (E). The electron beam was irradiated by using scanning electron microscope equipment. An electron beam aperture was about 50 nm, and the electron beam was irradiated to a relatively large area at a low energy. For the experiments of Table 1, an acceleration voltage was 5 kV, and an amount of current was 110 pA. For the experiments of Tables 2 and 3, an acceleration voltage was 5 kV, and an amount of current was 20 pA. In the electron beam irradiation process, a separate mask was not used, and the electron beam was irradiated to a specific area according to a coordinate using an align key. An area of the graphene sheet 130 exposed to the electron beam showed a tendency of increasing resistance due to interaction with the $Al_2O_3$ layer 140.

Lastly, a gate metal 170 was deposited on the $Al_2O_3$ layer 140 by using a lift-off process. The gate metal 170 was Cr/Au.

Figure 2:
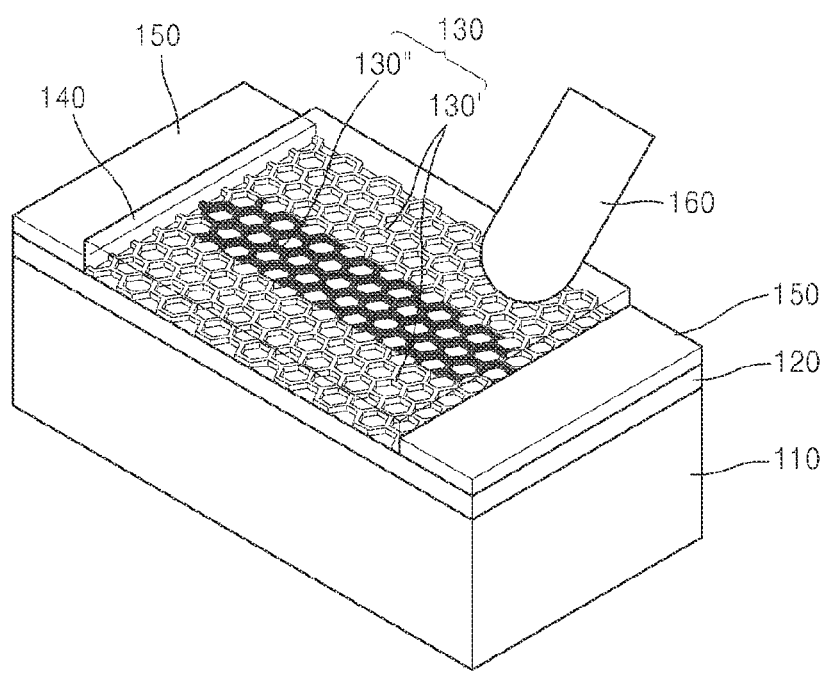
FIG. 2 is a diagram of a perspective view of a structure E of FIG. 1 and illustrates a process of electron beam irradiation.

FIG. 2 is a perspective view of the structure E of FIG. 1 and illustrates an electron beam irradiation process. As shown in FIG. 2, the insulating layer 120, i.e., the silicon oxide layer, was formed on the silicon substrate 110, the graphene sheet 130 is formed on the insulating layer 120, the contact lines 150, i.e., a Ti/Au layer, were formed on both ends of the graphene sheet 130, and the $Al_2O_3$ layer 140 was formed between the both ends and on the graphene sheet 130. The graphene sheet 130 includes an area 130" where the electron beam is not irradiated and an area 130' where the electron beam is irradiated. A resistance of the area 130' where the electron beam is irradiated increases significantly, and thus the area 130' loses its electrical characteristics, whereas the area 130" where the electron beam is not irradiated maintains electrical characteristics of graphene and thus may be used in electric appliances.

Figure 3:
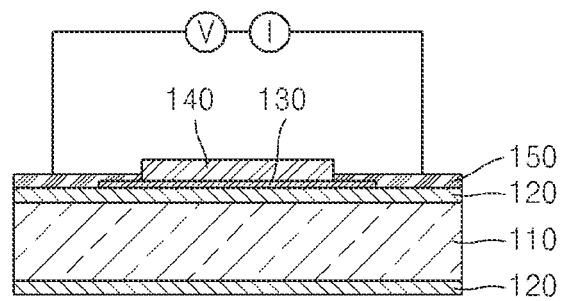
FIG. 3 is a diagram that illustrates the structure E of FIG. 1 connected to a power source.

FIG. 3 illustrates a structure of the structure E of FIG. 1 connected to a power source. A voltage was applied to the power source shown in FIG. 3 and the voltage was measured in order to observe a change in electric resistance before and after electron beam irradiation in the manufacturing process of the transistor. The voltage measurement was performed by using a Keithley 6487E PicoAmmeter in the following manner.

First, a structure to be measured was placed on a probe station. Two probe tips were, each respectively, connected to the contact lines at both ends of the structure to be measured. A resistance of the graphene sheet 130 was measured by applying a voltage of 1 mV and a current of about 10 µA to about 200 µA.

Table 1 shows electric resistances measured before and after the electron beam irradiation.

TABLE 1

| No.* | Before exposure (Ω) | After exposure (Ω) | No. | Before exposure (Ω) | After exposure (Ω) |
|---|---|---|---|---|---|
| 1 | 55K | 1.5M | 11 | 39K | 600K |
| 2 | 38K | 750K | 12 | 45K | 2.6M |
| 3 | 57K | 950K | 13 | 37K | 640K |
| 4 | 110K | 4M | 14 | 35K | 1.5M |
| 5 | 38K | 650K | 15 | 43K | 400K |
| 6 | 70K | 1.8M | 16 | 52K | 135K |
| 7 | 100K | 780K | 17 | 41K | 500K |
| 8 | 60K | 400K | 18 | 42K | 8M |
| 9 | 80K | 1M | 19 | 40K | 180K |
| 10 | 71K | 4.7M | 20 | 57K | 6M |

*indicates a replicate of the structure E.

In Table 1, an average voltage measured with respect to the structure E before the electron beam irradiation was 55.5 KΩ, whereas an average voltage measured with respect to the structure E after the electron beam irradiation was 1.8 MΩ.

Thus, the average voltage of the structure E after the electron beam irradiation increased 33 times than before the electron beam irradiation. The voltage of the structure E after the electron beam irradiation increased up to be 200 times greater than before the electron beam irradiation. As shown in Table 1, the voltage measured after the electron beam irradiation had a relatively large deviation, and this is deemed to be because the voltage differs according to a deviation caused by transferring of the graphene sheet 130, such as an adhesion force difference between a graphene sheet and a silicon oxide layer, an amount of solution remaining after the adhesion, or uniformity of the adhesion; a deviation caused by a photolithography process, such as an amount of the remaining PR, or a resistance change due to impurities included in the PR; and a deviation of a graphene micro ribbon manufactured under real manufacturing conditions.

Table 2 shows results of the electric resistances measured before and after the electron beam irradiation according to a number of irradiations.

TABLE 2

| Number of irradiation | Before exposure (KΩ) | After exposure (KΩ) | Increased amount (multiple) |
|---|---|---|---|
| 1 | 35 | 93 | 2.7 |
| 5 | 57 | 150 | 2.6 |
| 10 | 50 | 320 | 6.4 |

As shown in Table 2, the resistance increased as the number of irradiations increased. Thus, a magnitude of electric resistance may be controlled according to a number of irradiations or an amount of irradiation.

Table 3 shows results of a control group which shows the electric resistances before and after the electron beam irradiation to the same structure of the structure E of FIG. 1, except that the $Al_2O_3$ layer 140 is not included.

TABLE 3

| Number of irradiation | No.* | Before exposure (KΩ) | After exposure (KΩ) |
|---|---|---|---|
| 1 | 1 | 51 | 80 |
|   | 2 | 94 | 114 |
| 5 | 1 | 120 | 180 |
|   | 2 | 88 | 114 |
| 10 | 1 | 66 | 131 |
|   | 2 | 96 | 130 |

*The number "1" and number "2" indicates replicates of the structure E of Figure 1 without an $Al_2O_3$ layer.

As shown in Table 3, when the $Al_2O_3$ layer 140 is not included in the structure E of FIG. 1, an increase in resistance was relatively insignificant. Also, even when the number of irradiations was increased, the increase in resistance was less than 2.0 times, which was still insignificant compared to the cases when the layer 140 was included in the structure E of FIG. 1.

Also, resistance was measured after light irradiation at a wavelength of 365 nm instead of electron beam irradiation, but an increase in resistance did not occur regardless of the existence of the $Al_2O_3$ layer 140.

As described above, according to the one or more of the above embodiments of the present invention, graphene, carbon nanotubes, fullerene, graphite, or a combination thereof having a position-specific regulated resistance may be efficiently manufactured using a method of manufacturing graphene, carbon nanotubes, fullerene, graphite, or a combination thereof having a position-specific regulated resistance according to an embodiment of the present invention.

Also, according to another embodiment of the present invention, graphene, carbon nanotubes, fullerene, graphite, or a combination thereof having a position-specific regulated resistance may be efficiently used in electric appliances.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A method of manufacturing graphene, carbon nanotubes, fullerene, graphite, or a combination thereof, the method comprising:
   depositing a metal-containing material onto graphene, carbon nanotubes, fullerene, graphite, or a combination thereof, to form a structure having a metal-containing material layer, wherein the metal-containing material comprises Al, Ni, Fe, Co, Ti, Cr, or a combination thereof; and
   irradiating an electron beam on the structure and through the metal-containing material layer.

2. The method of claim 1, wherein the electron beam is irradiated onto only a portion of the structure, and an area of the structure where the electron beam is irradiated has an electrical resistance that is increased compared to an area where the electron beam is not irradiated.

3. The method of claim 1, wherein the electrical resistance of an area where the electron beam is irradiated is at least 50 times greater than the electrical resistance of an area where the electron beam is not irradiated.

4. The method of claim 1, wherein the metal-containing material is an insulating material.

5. The method of claim 1, wherein the metal-containing material is a metal oxide.

6. The method of claim 1, wherein the metal oxide is $Al_2O_3$.

7. The method of claim 1, wherein a thickness of the metal-containing material is in a range of about 0.1 nm to about 1000 nm.

8. The method of claim 1, wherein the metal-containing material is deposited by filament deposition, E-beam evaporation, sputter deposition, atomic layer deposition (ALD), chemical vapor deposition (CVD), or a combination thereof.

9. The method of claim 1, wherein the electron beam is irradiated onto the structure in the presence of an electron beam mask.

10. The method of claim 1, wherein the electron beam is irradiated onto the structure in the presence of an electron beam resist or without the electron beam resist.

11. The method of claim 1, wherein the graphene, carbon nanotubes, fullerene, graphite, or combination thereof is suspended and not supported by a substrate.

12. The method of claim 1 further comprising disposing the graphene, carbon nanotubes, fullerene, graphite, or combination thereof on a substrate.

13. The method of claim 12, wherein the substrate is an insulating material.

14. The method of claim 10, wherein the substrate is silicon, a silicon oxide, a silicon nitride ($Si_3N_4$), $Al_2O_3$, $TiO_2$, sapphire, or a combination thereof.

15. The method of claim 1, wherein the metal-containing material is separated from the graphene, carbon nanotubes, fullerene, graphite, or combination thereof after the irradiating.

16. The method of claim 1 further comprising, after irradiating the electron beam onto the structure, removing at least part of the structure where the electron beam is irradiated.

17. The method of claim 1, wherein the electron beam is irradiated on only a portion of the structure, and the method further comprises
   forming a source electrode and a drain electrode opposite each other relative to the graphene, carbon nanotubes, fullerene, graphite, or combination thereof, and in contact with the graphene, carbon nanotubes, fullerene, graphite, or combination thereof; and
   forming a gate electrode on an area of the structure where the electron beam is not irradiated to provide a field effect transistor (FET).

18. Graphene, carbon nanotubes, fullerene, graphite, or combination thereof manufactured by the method of claim 1.

19. The graphene, carbon nanotubes, fullerene, graphite, or combination thereof of claim 18, wherein the graphene, carbon nanotubes, fullerene, graphite, or combination thereof comprises a graphene nanoribbon.

* * * * *